(12) United States Patent
Ando et al.

(10) Patent No.: US 9,570,569 B2
(45) Date of Patent: Feb. 14, 2017

(54) SELECTIVE THICKENING OF PFET DIELECTRIC

(71) Applicant: International Business Machines Corporation, Armonk, NY (US)

(72) Inventors: Takashi Ando, Tuckahoe, NY (US); Hemanth Jagannathan, Niskayuna, NY (US); Barry P. Linder, Hastings-on-Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/744,659

(22) Filed: Jun. 19, 2015

(65) Prior Publication Data
US 2016/0329409 A1 Nov. 10, 2016

Related U.S. Application Data

(63) Continuation of application No. 14/706,114, filed on May 7, 2015.

(51) Int. Cl.
*H01L 21/70* (2006.01)
*H01L 29/423* (2006.01)
(Continued)

(52) U.S. Cl.
CPC ..... *H01L 29/42364* (2013.01); *H01L 27/0922* (2013.01); *H01L 29/42372* (2013.01); *H01L 29/4966* (2013.01)

(58) Field of Classification Search
CPC ............ H01L 21/823857; H01L 21/823842; H01L 27/092; H01L 27/0922; H01L 29/4966; H01L 29/42364; H01L 29/42372
(Continued)

(56) References Cited

U.S. PATENT DOCUMENTS

2007/0184619 A1* 8/2007 Hergenrother .... H01L 21/28097
438/287
2012/0139057 A1* 6/2012 Goto ................ H01L 21/28167
257/392
(Continued)

OTHER PUBLICATIONS

List of IBM Patents or Patent Applications Treated as Related; (Appendix P), Filed Jul. 9, 2015; 2 pages.
(Continued)

*Primary Examiner* — Victor A Mandala
*Assistant Examiner* — Colleen E Snow
(74) *Attorney, Agent, or Firm* — Cantor Colburn LLP; Vazken Alexanian

(57) ABSTRACT

A complementary metal-oxide semiconductor (CMOS) device and a method of fabricating a CMOS device are described. The method includes forming an interfacial layer in a trench on a substrate in both a p-channel field effect transistor (pFET) area of the CMOS device and an n-channel FET (nFET) area of the CMOS device, depositing a high-k dielectric on the interfacial layer in both the pFET area and the nFET area, selectively forming a first metal layer on the high-k dielectric in only the pFET area, and depositing a second metal layer on the first metal layer in the pFET area and on the high-k dielectric in the nFET area. The method also includes performing an anneal that increases a thickness of the interfacial layer in only the pFET area.

6 Claims, 16 Drawing Sheets

(51) Int. Cl.
*H01L 27/092* (2006.01)
*H01L 29/49* (2006.01)

(58) Field of Classification Search
USPC .................................... 257/204, 369
See application file for complete search history.

(56) References Cited

U.S. PATENT DOCUMENTS

2013/0015580 A1* 1/2013 Jain .................. H01L 21/82380
257/751
2013/0285150 A1* 10/2013 Chen ...................... H01L 29/78
257/369
2014/0242788 A1* 8/2014 Dilliway ........... H01L 21/28255
438/590

OTHER PUBLICATIONS

Takashi Ando et al., "Selective Thickening of PFET Dielectric", U.S. Appl. No. 14/706,114, filed May 7, 2015.
List of IBM Patents or Patent Applications Treated as Related; (Appendix P), Filed Aug. 1, 2016; 2 pages.
Takashi Ando et al., "Selective Thickening of PFET Dielectric", U.S. Appl. No. 15/224,876, filed Aug. 1, 2016.

* cited by examiner

US 9,570,569 B2

SELECTIVE THICKENING OF PFET DIELECTRIC

This application is a continuation of U.S. application Ser. No. 14/706,114 filed May 7, 2015, the disclosure of which is incorporated by reference herein in its entirety.

BACKGROUND

The present invention relates to complementary metal-oxide semiconductor (CMOS) technology, and more specifically, to selective thickening of p-type or p-channel field effect transistor (pFET) dielectric.

A CMOS device typically includes complementary and symmetrical pairs of p-type and n-type metal oxide semiconductor field effect transistors (MOSFETs) or a pFET and n-type or n-channel FET (nFET) pair. Negative-bias temperature instability (NBTI) is a reliability issue in the pFET region or area of the CMOS device in particular and manifests as an increase in threshold voltage and corresponding decrease in drain current. NBTI limits the scaling of inversion layer thickness (Tinv).

SUMMARY

According to one embodiment of the present invention, a method of fabricating a complementary metal-oxide semiconductor (CMOS) device includes forming an interfacial layer in a trench on a substrate in both a p-channel field effect transistor (pFET) area of the CMOS device and an n-channel FET (nFET) area of the CMOS device; depositing a high-k dielectric on the interfacial layer in both the pFET area and the nFET area; selectively forming a first metal layer on the high-k dielectric in only the pFET area; depositing a second metal layer on the first metal layer in the pFET area and on the high-k dielectric in the nFET area; and performing an anneal that increases a thickness of the interfacial layer in only the pFET area.

According to another embodiment, a complementary metal-oxide semiconductor (CMOS) device includes an n-type field effect transistor (nFET) region, the nFET region including an interfacial layer of a first thickness formed on an nFET substrate; and a p-type field effect transistor (pFET) region, the pFET region including the interfacial layer of a second thickness formed on a pFET substrate, the first thickness being less than the second thickness.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-13 are cross sectional views illustrating stages in the formation of a CMOS device according to embodiments of the invention, in which:

FIG. 1 is a cross sectional view of an intermediate structure in the CMOS fabrication process according to an embodiment;

FIG. 2 shows the result of deposition of a metal layer on the structure shown in FIG. 1;

FIG. 3 results from removal of the metal layer from the nFET area;

FIG. 4 is a cross sectional view of an intermediate structure resulting from deposition of another metal layer on the structure shown in FIG. 3;

FIG. 5 results from deposition of an amorphous silicon layer;

FIG. 6 shows the thicker interfacial layer in the pFET area resulting from a rapid thermal anneal (RTA) process;

FIG. 7 results from removal of the amorphous silicon layer;

FIG. 8 shows the result of an optional removal of the metal layers;

FIG. 9 shows the structure resulting from deposition of a pFET workfunction setting metal layer in both the nFET and pFET areas;

FIG. 10 results from removal of the pFET workfunction setting metal layer from the nFET area;

FIG. 11 is the structure resulting from deposition of an nFET workfunction setting metal layer in both the nFET and pFET areas;

FIG. 12 shows the intermediate structure of FIG. 11 with a low resistivity metal layer deposited in both the nFET and pFET areas; and FIG. 13 shows the result of chemical mechanical planarization on the structure of FIG. 12;

FIGS. 14-16 illustrate an alternate embodiment of the processes shown in FIGS. 9-11, in which:

FIG. 14 shows the structure resulting from deposition of an nFET workfunction setting metal layer in both the nFET and pFET areas;

FIG. 15 results from removal of the nFET workfunction setting metal layer from the pFET area; and FIG. 16 is the structure resulting from deposition of a pFET workfunction setting metal layer in both the nFET and pFET areas.

DETAILED DESCRIPTION

As noted above, in a CMOS device, NBTI limits the scaling of Tinv in the pFET. Embodiments detailed herein relate to fabricating the pFET with a thicker interfacial layer or IL. The thicker interfacial layer improves NBTI in the pFET. Further, because there is limited equivalent oxide thickness (EOT) increase in the nFET, any performance penalty for the nFET resulting from the improved NBTI for the pFET is also limited.

Figure 1:
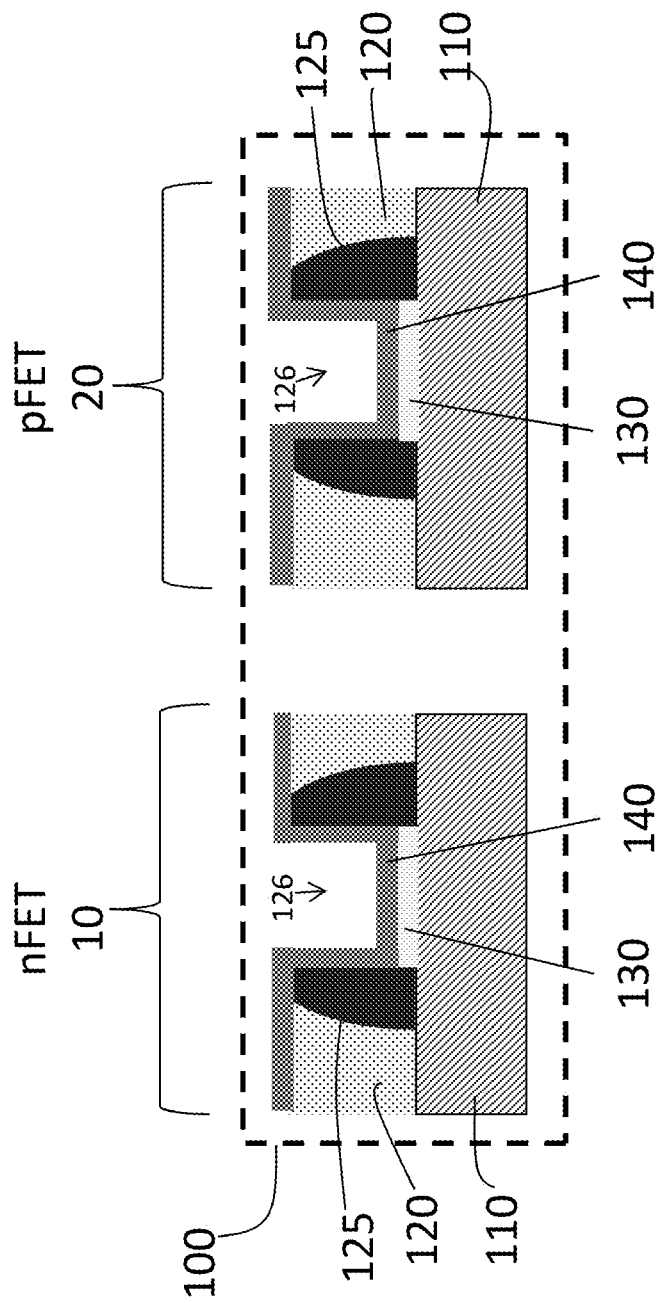

FIGS. 1-13 are cross sectional views illustrating stages in the formation of a CMOS device 100 according to embodiments of the invention. FIG. 1 is a cross sectional view of an intermediate structure of the CMOS 100 according to an embodiment. FIG. 1 specifically illustrates a point in high-k metal gate (HKMG) processing following dummy gate removal. The nFET 10 and the pFET 20 may be electrically isolated from each other as shown in the figures. In alternate embodiments, the nFET 10 and pFET 20 may be coupled and may share a substrate 110. An interlayer dielectric 120 is formed on the substrate 110 of each of the nFET 10 and the pFET 20. The interlayer dielectric 120 may be silicon dioxide ($SiO_2$), for example. In the intermediate stage shown in FIG. 1, a trench 126 is formed in the interlayer dielectric 120 with spacers 125 on either side of the trench. The spacers 125 may be formed from silicon nitride (SiN), for example. The trench 126 is formed as a result of the dummy gate removal. An interfacial layer 130 is formed on the substrate 110 in the trench 126. The interfacial layer 130 may be comprised of $SiO_2$ or silicon oxynitride (SiON) and may typically range in thickness from 0.5 to 1.0 nanometers (nm), for example. Alternate embodiments contemplate other thicknesses for the interfacial layer 130. A high-k dielectric 140 is conformally deposited on the interfacial layer 130, spacers 125, and interlayer dielectric 120. Many high-k dielectric materials are known and are typically deposited using atomic layer deposition (ALD). Exemplary high-k dielectric 140 materials include hafnium oxide ($HfO_2$), zirconium oxide ($ZrO_2$), lanthanum oxide ($La_2O_3$) and aluminum oxide ($Al_2O_3$).

Figure 2:
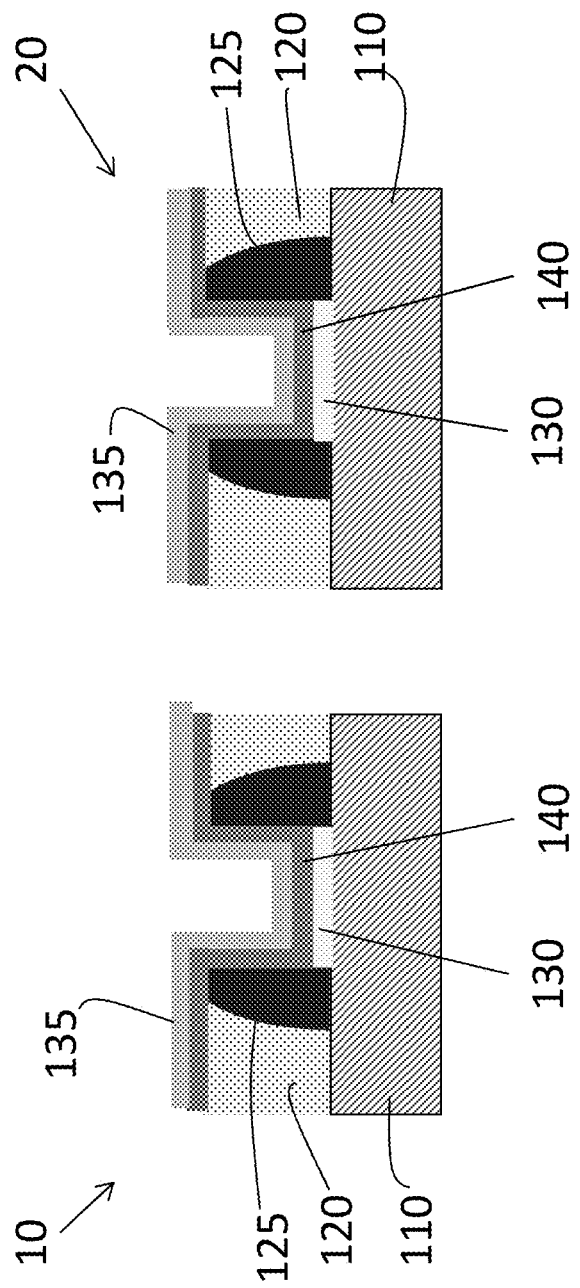
Figure 3:
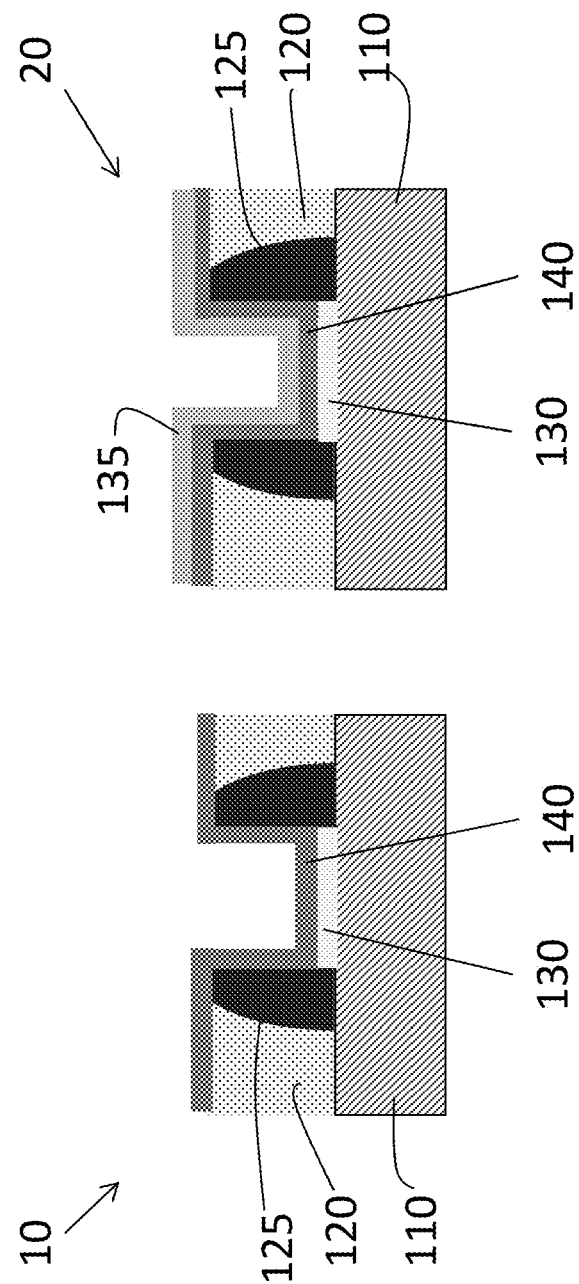
Figure 4:
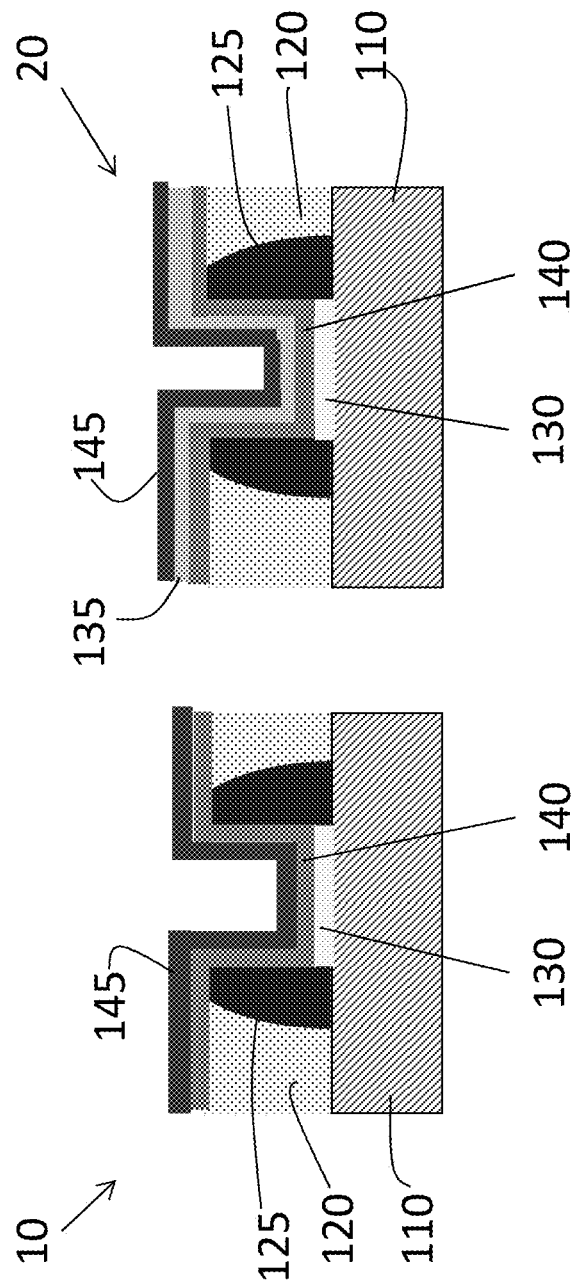
Figure 5:
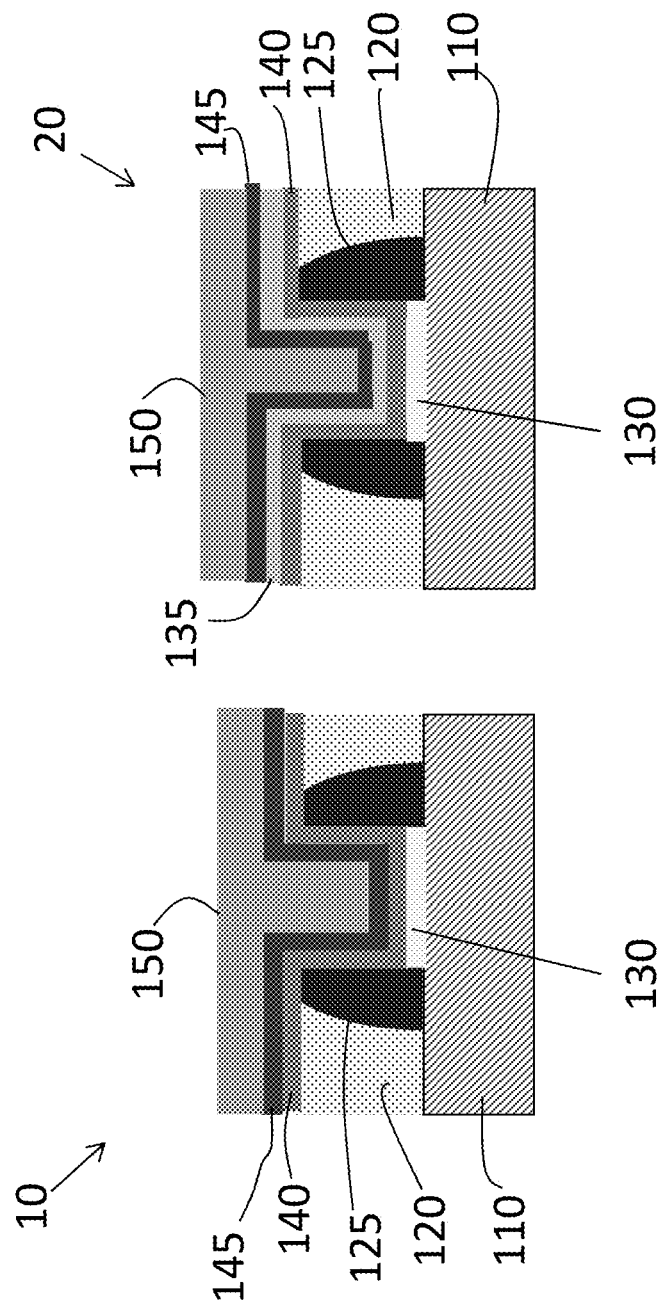
Figure 6:
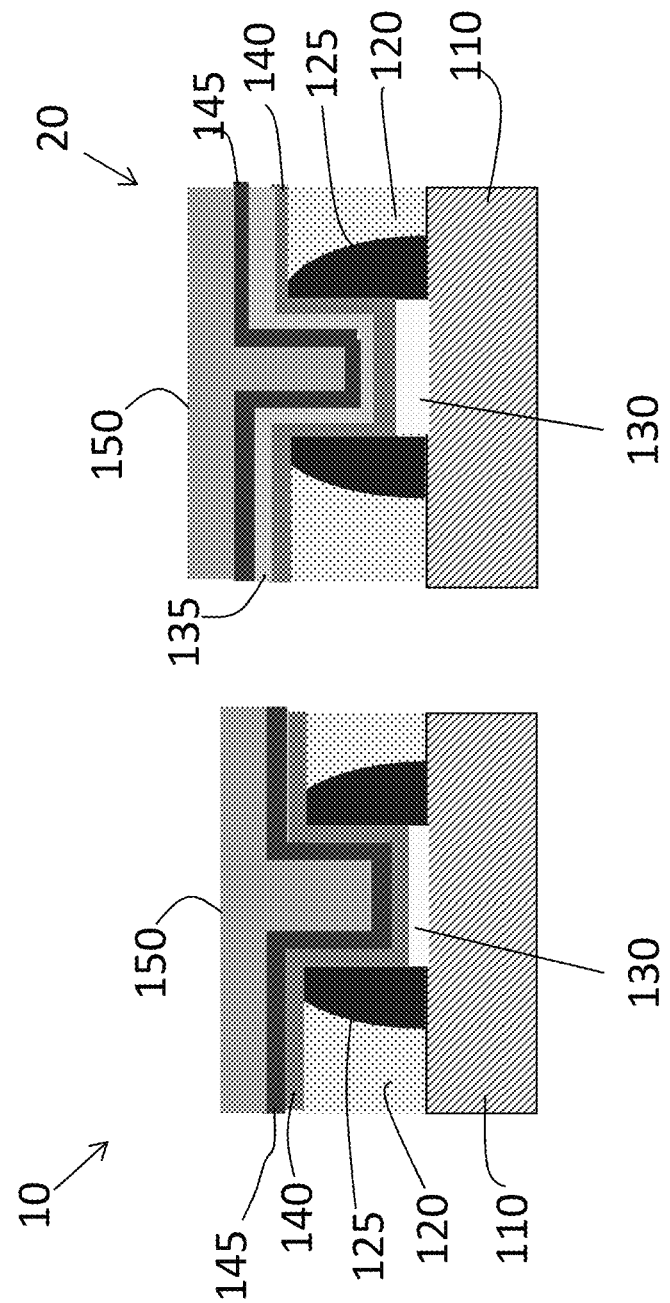

FIG. 2 is a cross-sectional view of the structure resulting from the conformal deposition of a metal layer 135 on the high-k dielectric 140 on both the nFET 10 and pFET 20 sides. The metal layer 135 may be titanium nitride (TiN), titanium carbide (TiC), tantalum nitride (TaN), or tantalum carbide (TaC), for example. FIG. 3 shows the structure resulting from removal of the metal layer 135 from only the nFET 10 region. This removal may be accomplished by using a resist mask and a wet etch process, for example. As shown in FIG. 4, a metal layer 145 is deposited conformally on the metal layer 135 in the pFET 20 region and on the high-k dielectric 140 in the nFET 10 region. The metal layer 145 may be TiN, TiC, TaN, or TaC, for example. FIG. 5 is a cross-sectional view of an intermediate structure with a dummy amorphous silicon layer 150 deposited in the trench 126 and on the metal layer 145 in the nFET 10 and pFET 20 areas. A rapid thermal anneal (RTA) process may be performed on the structure shown in FIG. 5. The anneal temperature may be 800 to 1100 degrees Celsius. The duration of the anneal process may vary from a spike (no hold time at the peak temperature) to a hold time at the peak temperature of 5 seconds. The anneal conditions may include ambient nitrogen. Alternatively, a millisecond anneal (e.g., a laser anneal or flash lamp anneal) may be may be performed. The anneal process results in the structure shown in FIG. 6, in which the interfacial layer 130 in the pFET 20 area is thicker than the interfacial layer 130 in the nFET 10 area. The thicker interfacial layer 130 in the pFET 20 area improves NBTI in the pFET 20 area. The thicker interfacial layer 130 results from the fact that dissolved oxygen in a metal layer generally causes interfacial layer growth during anneal. Because of the additional metal layer 135 in the pFET 20 area as compared to the nFET 10 area, a larger amount of dissolved oxygen results in the pFET 20 area. This additional dissolved oxygen, in turn, results in the thicker interfacial layer 130 in the pFET 20 area. The additional thickness may be in the range of 0.05 to 0.4 nm, for example. As noted above with regard to the initial interfacial layer 130 thickness, values outside the exemplary ranges are contemplated, as well. The additional thickness in the pFET 20 region, resulting from the additional metal layer 135, is the common feature of the embodiments.

Figure 7:
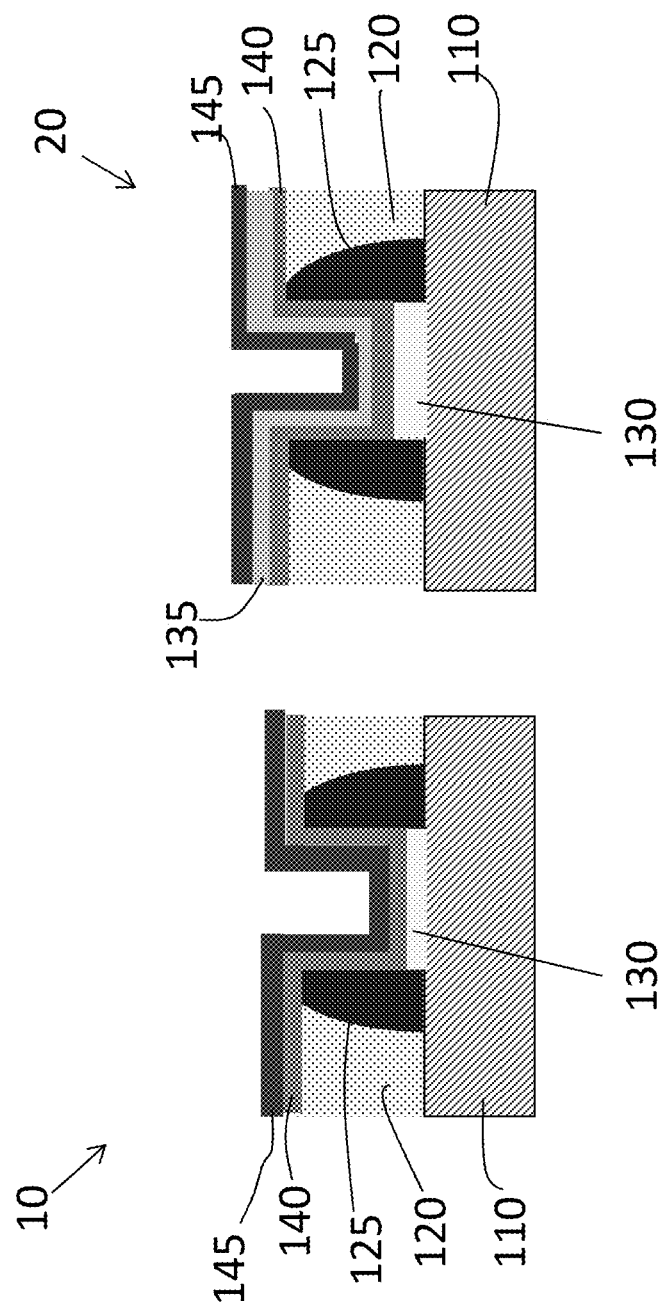
Figure 8:
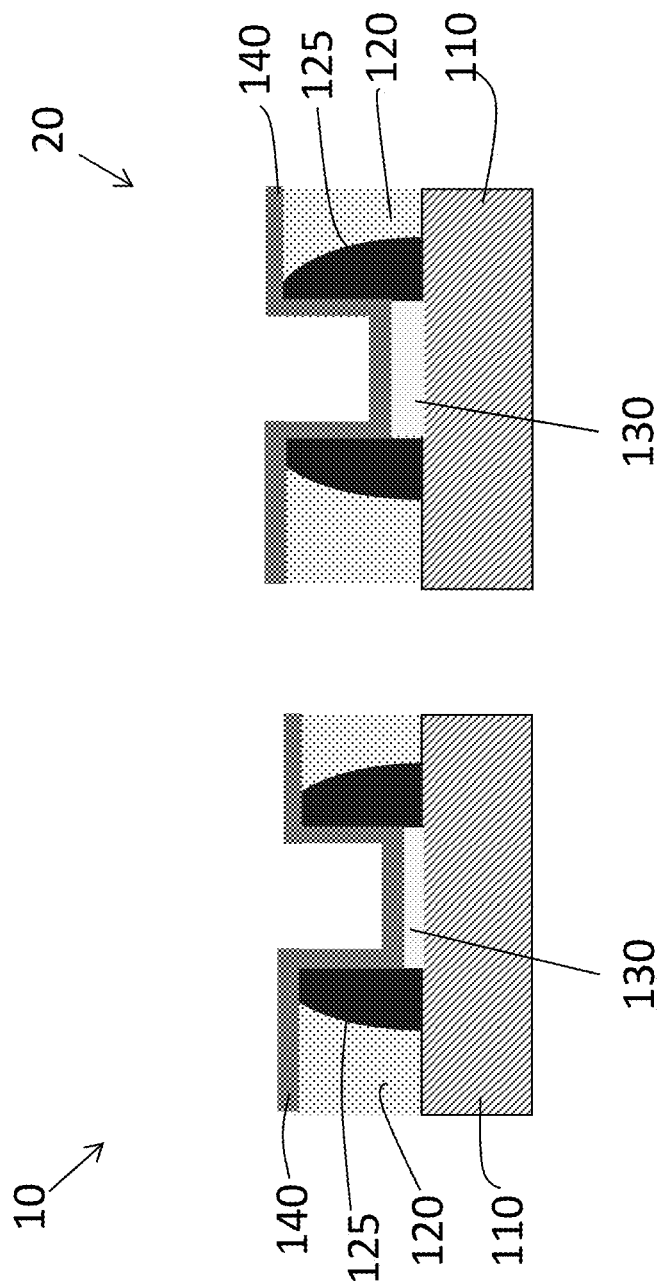

FIG. 7 is the intermediate structure resulting from removal of the dummy amorphous silicon layer 150 from both the nFET 10 and pFET 20 regions. Optionally, the metal layer 135 from the pFET 20 area and the metal layer 145 from both the nFET 10 and pFET 20 areas may be removed, stopping on the high-k dielectric layer 140, resulting in the structure shown in FIG. 8. A pFET workfunction setting metal layer 155 is conformally deposited in both the nFET 10 and pFET 20 regions, resulting in the structure shown in FIG. 9. The pFET workfunction setting metal layer 155 may be TiN. The pFET workfunction setting metal layer 155 is removed from only the nFET 10 area to provide the structure shown in FIG. 10. As shown in FIG. 11, an nFET workfunction setting metal layer 160 is then conformally deposited on the pFET workfunction setting metal layer 155 in the pFET 20 area and on the high-k dielectric 140 in the nFET 10 area. The nFET workfunction setting metal layer 160 may be an aluminum alloy, for example. In FIG. 12, a low resistivity metal layer 165 is deposited in the trench 126 and on the nFET workfunction setting metal layer 160 in both the nFET 10 and pFET 20 areas. The low resistivity metal layer 165 may be aluminum (Al) or tungsten (W), for example. The structure shown in FIG. 13 results from a chemical mechanical planarization (CMP) process on the structure shown in FIG. 12 to achieve device isolation. From this stage, conventional processes may be performed to complete the fabrication of the CMOS device 100. The CMOS device 100 will have an pFET 20 with a thicker interfacial layer 130 than the nFET 10.

Figure 9:
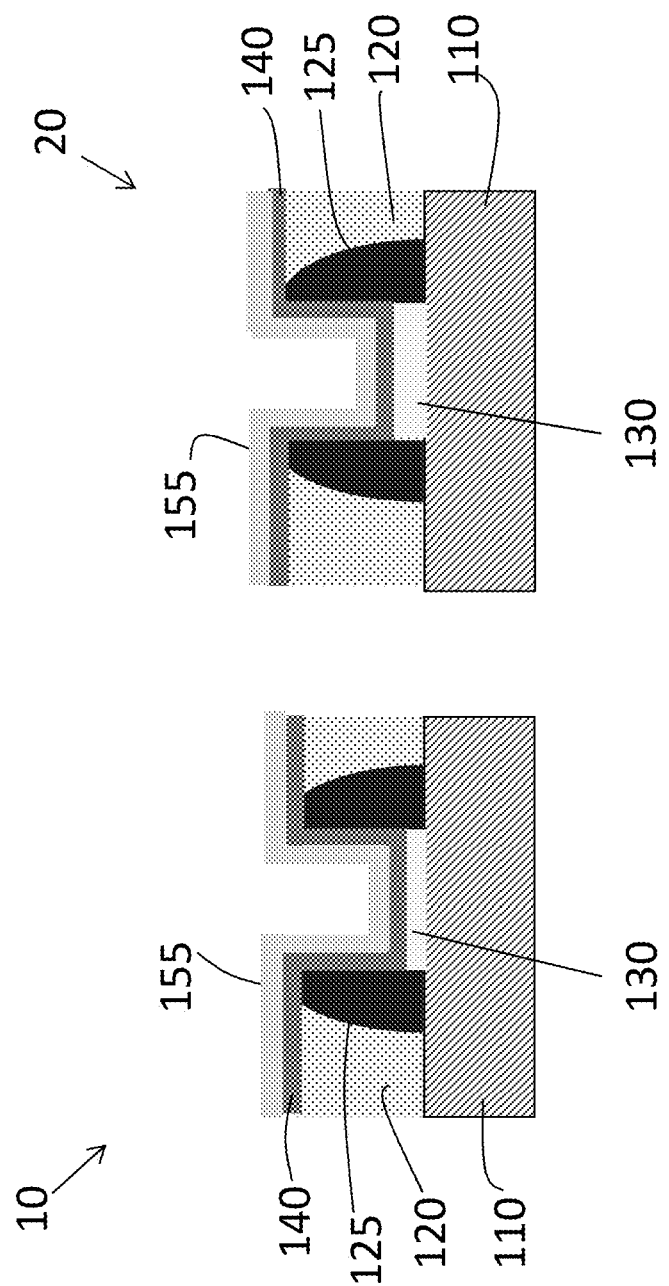
Figure 10:
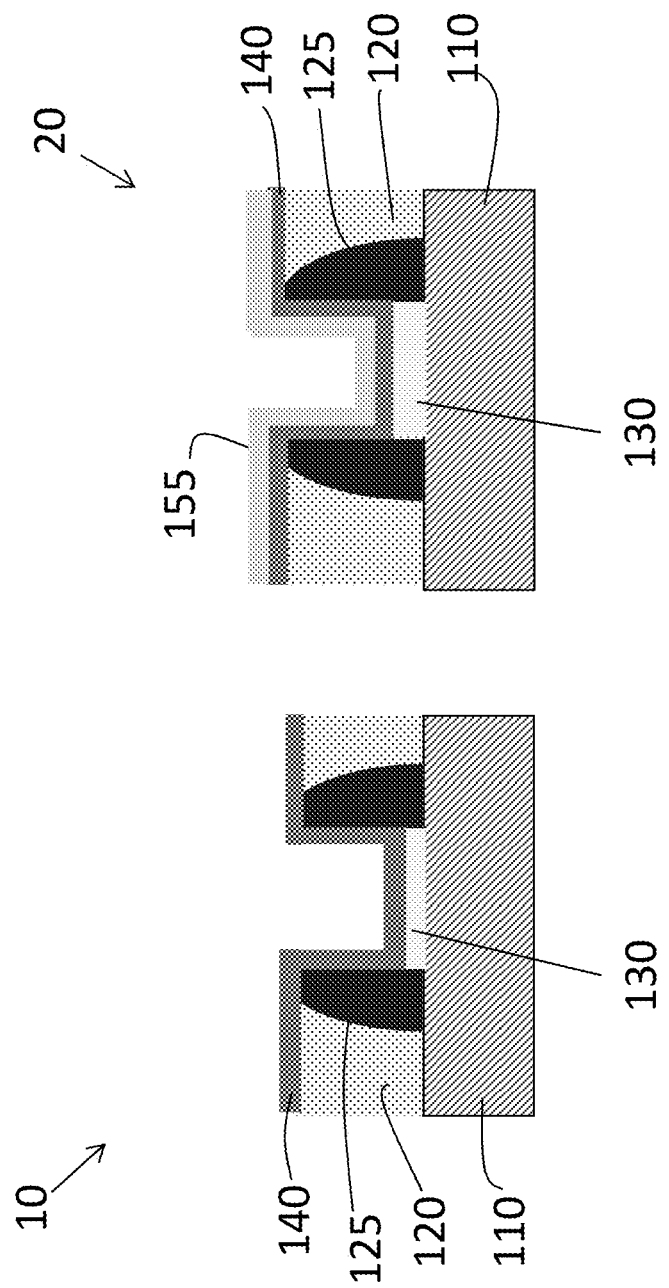
Figure 11:
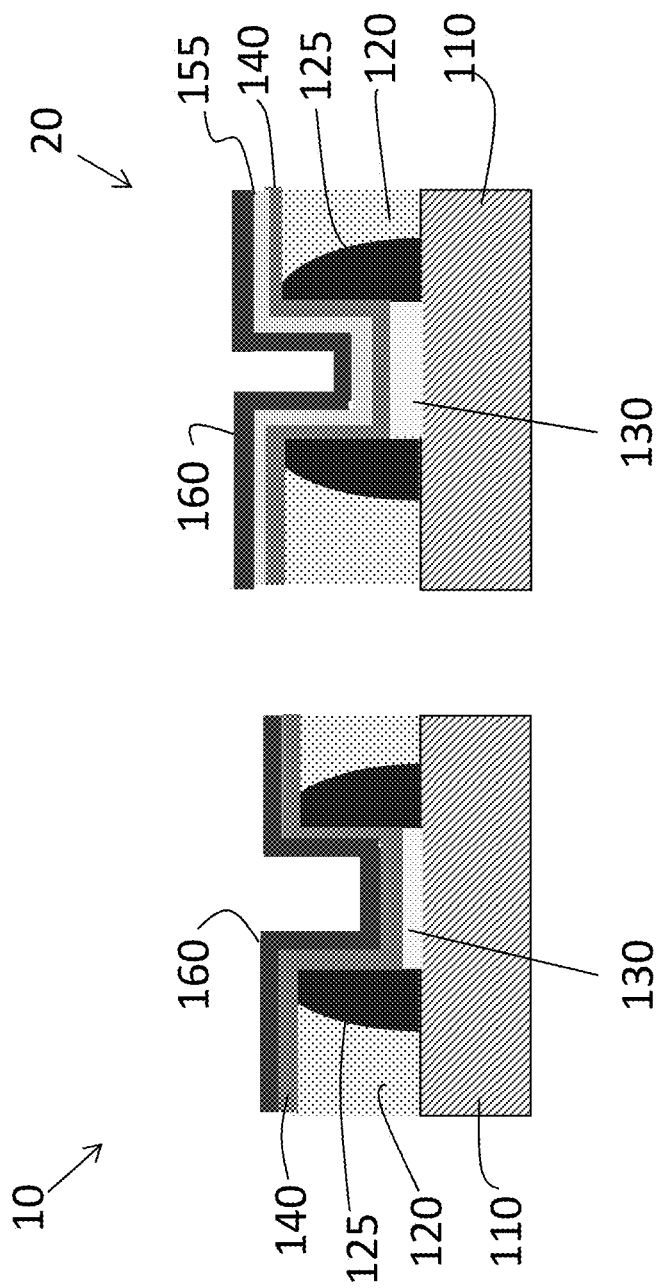
Figure 12:
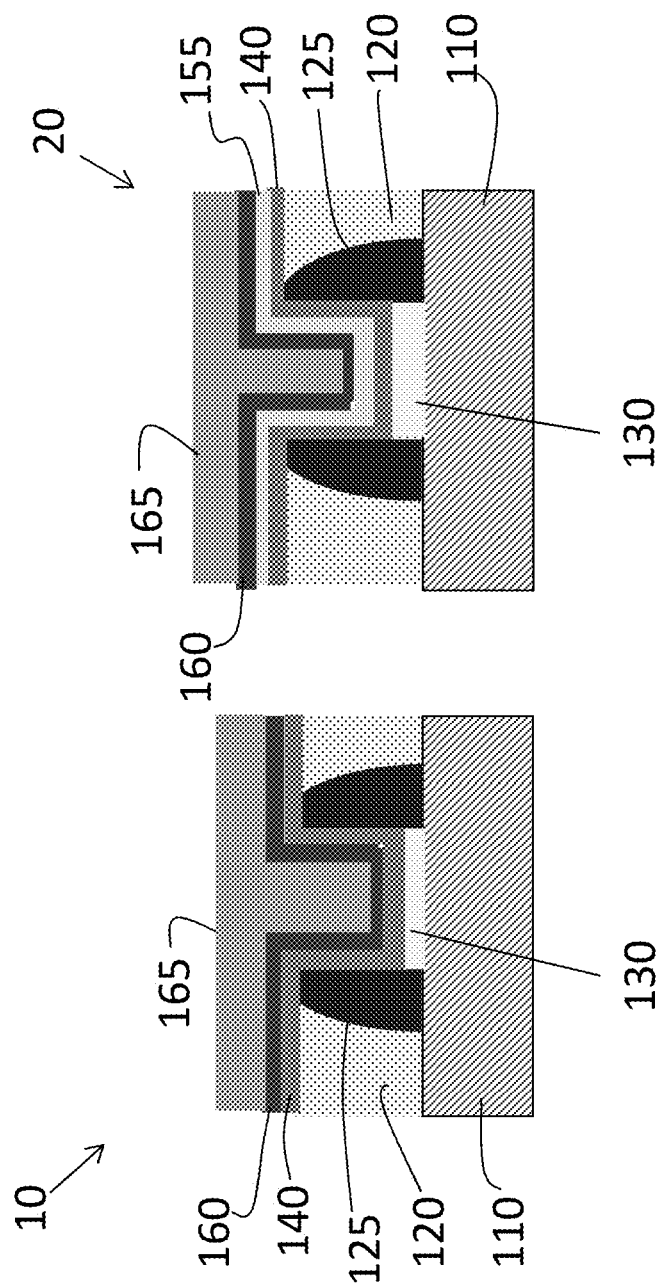
Figure 13:
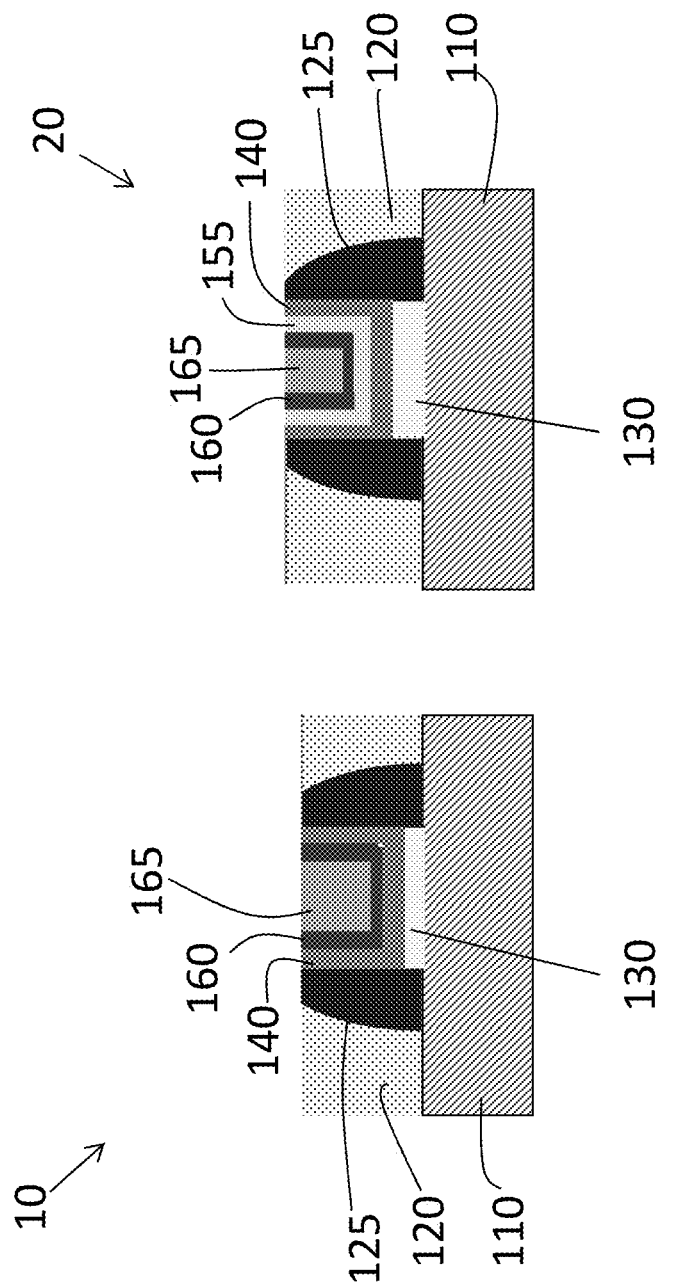
Figure 14:
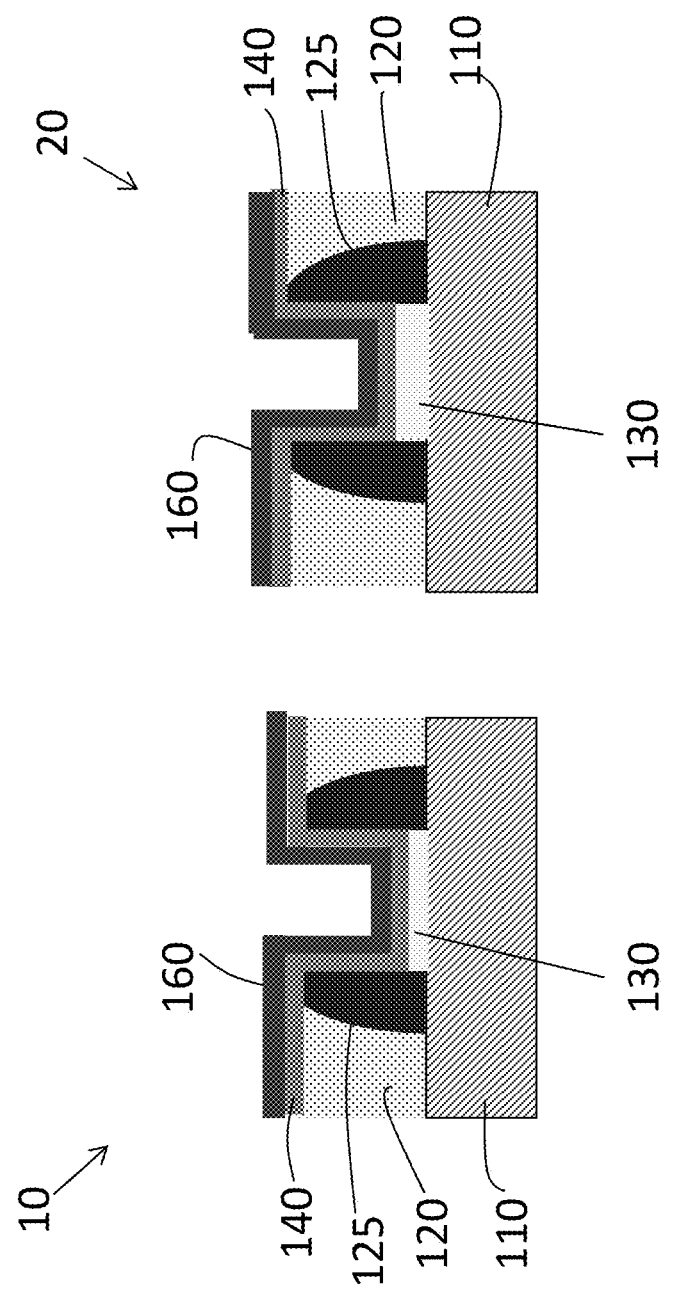
Figure 15:
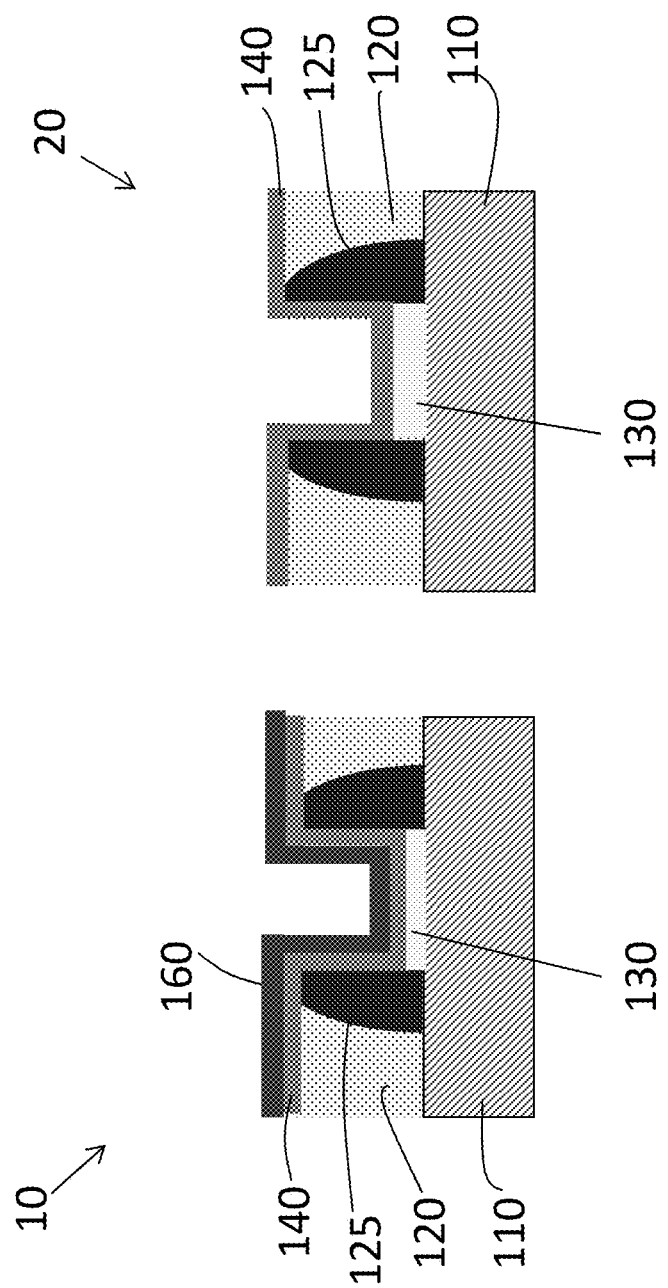
Figure 16:
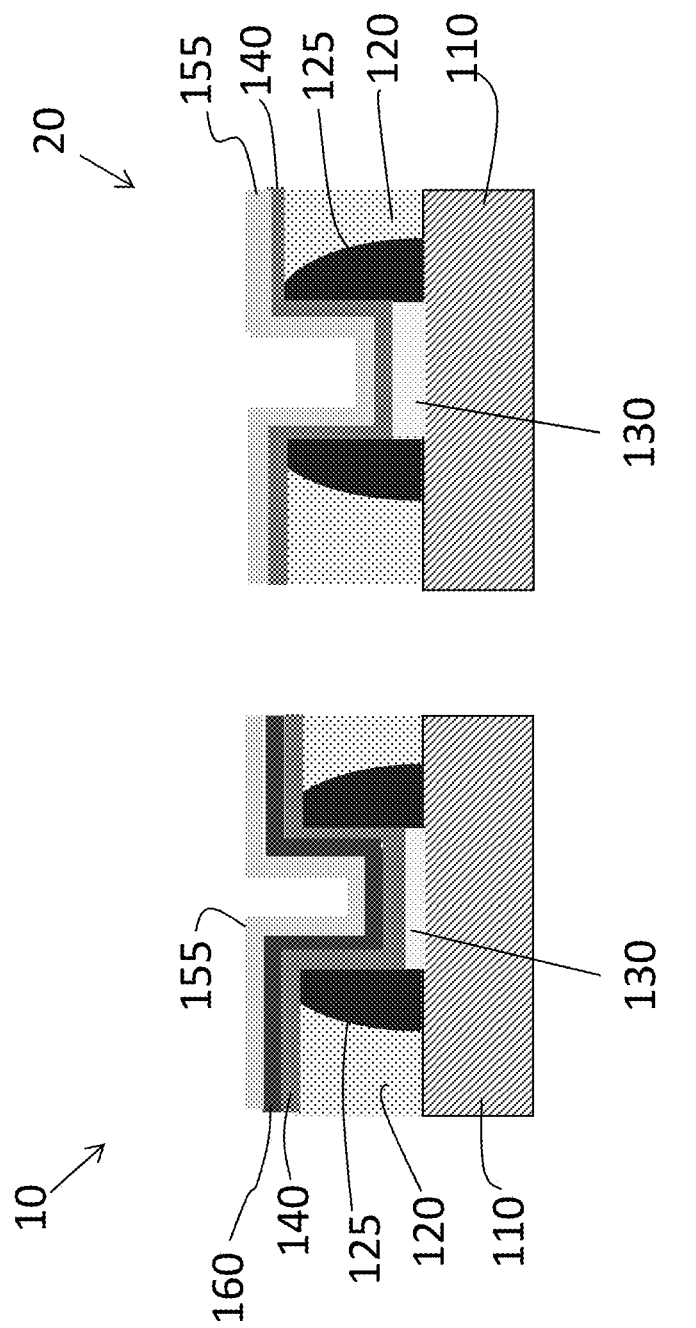

FIGS. 14-16 illustrate an alternate embodiment to the one shown in FIGS. 9-11. FIGS. 14-16 illustrate processes analogous to processes shown in FIGS. 9-11, which all occur after the thickening of the interfacial layer 130 in the pFET 20 region. FIG. 14 results from the deposition of the nFET workfunction setting metal layer 160 on the high-k dielectric 140 in both the nFET 10 and pFET 20 areas. The nFET workfunction setting metal layer 160 is then removed from the pFET 20 region to result in the structure of FIG. 15. The pFET workfunction setting metal layer 155 is then deposited on the high-k dielectric 140 in the pFET 20 region and on the nFET workfunction setting metal layer 160 in the nFET 10 area, as shown in FIG. 16. At this stage, deposition of the low resistivity metal layer 165 (see FIG. 12) and other known processing steps may be completed to fabricate the CMOS device 100.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A complementary metal-oxide semiconductor (CMOS) device, comprising:
    an n-type field effect transistor (nFET) region, the nFET region including an interfacial layer of a first thickness formed on an nFET substrate; and
    a p-type field effect transistor (pFET) region, the pFET region including the interfacial layer of a second thickness formed on a pFET substrate, the first thickness being less than the second thickness, wherein the nFET region and the pFET region are regions of a same CMOS device.

2. The device according to claim 1, wherein the first thickness is 0.5 to 1 nanometers.

3. The device according to claim 2, wherein a difference between the first thickness and the second thickness is 0.05 to 0.4 nanometers.

4. The device according to claim 1, wherein the nFET region includes an nFET workfunction setting metal layer deposited on an nFET high-k dielectric and the pFET region includes a pFET workfunction setting metal layer deposited on a pFET high-k dielectric.

5. The device according to claim 4, wherein the nFET workfunction setting metal layer includes an aluminum alloy.

6. The device according to claim 4, wherein the pFET workfunction setting metal layer includes titanium nitride (TiN).

* * * * *